Figure 1:
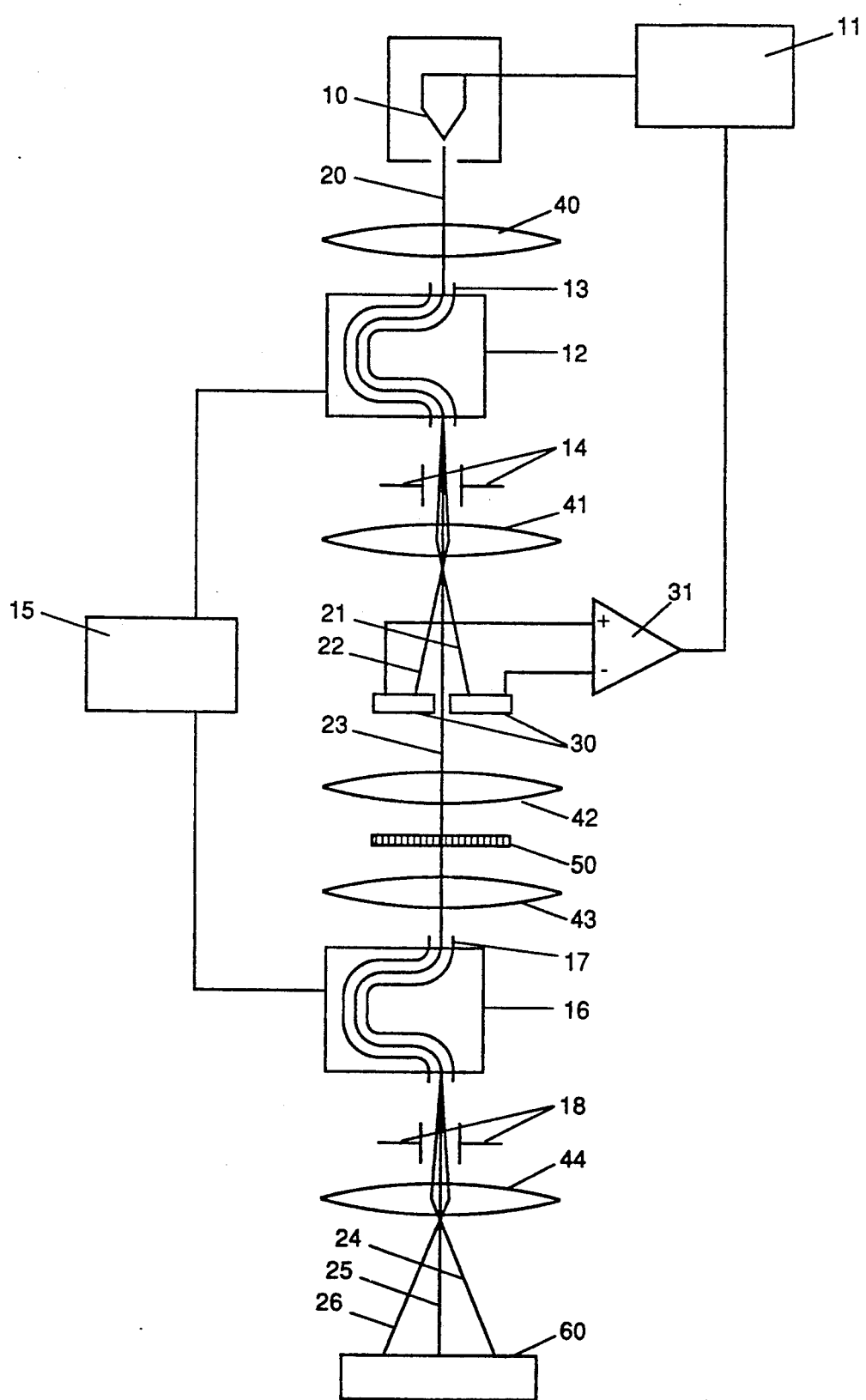

United States Patent [19]
Krivanek

[11] Patent Number: 5,097,126
[45] Date of Patent: Mar. 17, 1992

[54] HIGH RESOLUTION ELECTRON ENERGY LOSS SPECTROMETER

[75] Inventor: Ondrej L. Krivanek, Oakland, Calif.

[73] Assignee: Gatan, Inc., Pleasanton, Calif.

[21] Appl. No.: 587,665

[22] Filed: Sep. 25, 1990

[51] Int. Cl.$^5$ .............................................. H01J 49/44
[52] U.S. Cl. ................... 250/305; 250/311; 250/397
[58] Field of Search ............... 250/305, 311, 306, 307, 250/397

[56] References Cited

U.S. PATENT DOCUMENTS

| | | | |
|---|---|---|---|
| 2,429,558 | 10/1947 | Marton | 250/311 |
| 3,806,728 | 4/1974 | Lindholm et al. | 250/305 |
| 3,975,640 | 8/1976 | Boux et al. | 250/397 |
| 4,044,254 | 8/1977 | Krisch et al. | 250/311 |
| 4,071,765 | 1/1978 | Van Oostrum et al. | 250/397 |
| 4,789,780 | 12/1988 | Le Poole et al. | 250/311 |
| 4,851,670 | 7/1989 | Krivanek | 250/311 |
| 4,990,778 | 2/1991 | Norioka | 250/397 |

OTHER PUBLICATIONS

"High Resolution, Low Energy Electron Spectrometer", by J. A. Simpson from the Review of Scientific Instrument, vol. 35, No. 12, Dec. 1964, pp. 1698-1704.
H. Boersch, J. Geiger and W. Stickel, "Das Auflösungsvermögen des elektostatisch-magnetischen Energieanalyzators für schnelle Elektronen", Zeitschrift für Physik, vol. 180, pp. 415-424 (1964).
P. C. Gibbons, J. J. Ritsko and S. E. Schnatterly, "Inelastic Electron Scattering Spectrometer", Rev. Sci. Instr. 46, 1546 (1975).
P. E. Batson, "High Resolution Electron Spectrometer for 1-nm Spatial Analysis", Rev. Sci. Instr. 57, 43 (1986).

Primary Examiner—Jack I. Berman
Assistant Examiner—Kiet T. Nguyen

[57] ABSTRACT

A method and an apparatus comprising an electron gun, two energy analyzers, an energy-selecting slit with intensity sensors, a feedback circuit, a sample, and an electron detector. The beam produced by the electron gun is dispersed according to the energies of the electrons by the first energy analyzer. The dispersed beam impinges on a slit which monochromates the beam by selecting a narrow pass-band of energies. The two halves of the slit are equipped with electron intensity sensors whose output is used by a feedback circuit to stabilize the position of the dispersed beam on the slit so as to counteract instabilities in the power supplies of the electron gun and of the analyzer. The monochromated electron beam then passes through a sample, and the transmitted beam is dispersed according to the energies of the electrons by the second energy analyzer. The power supplies of the two analyzers are linked so that the energy selected by the second analyzer tracks the energy selected by the first analyzer. The second analyzer therefore automatically tracks instabilities in the gun high voltage, and the whole apparatus is able to achieve much higher energy resolution than if all the power supplies were operated independently.

10 Claims; 2 Drawing Sheets

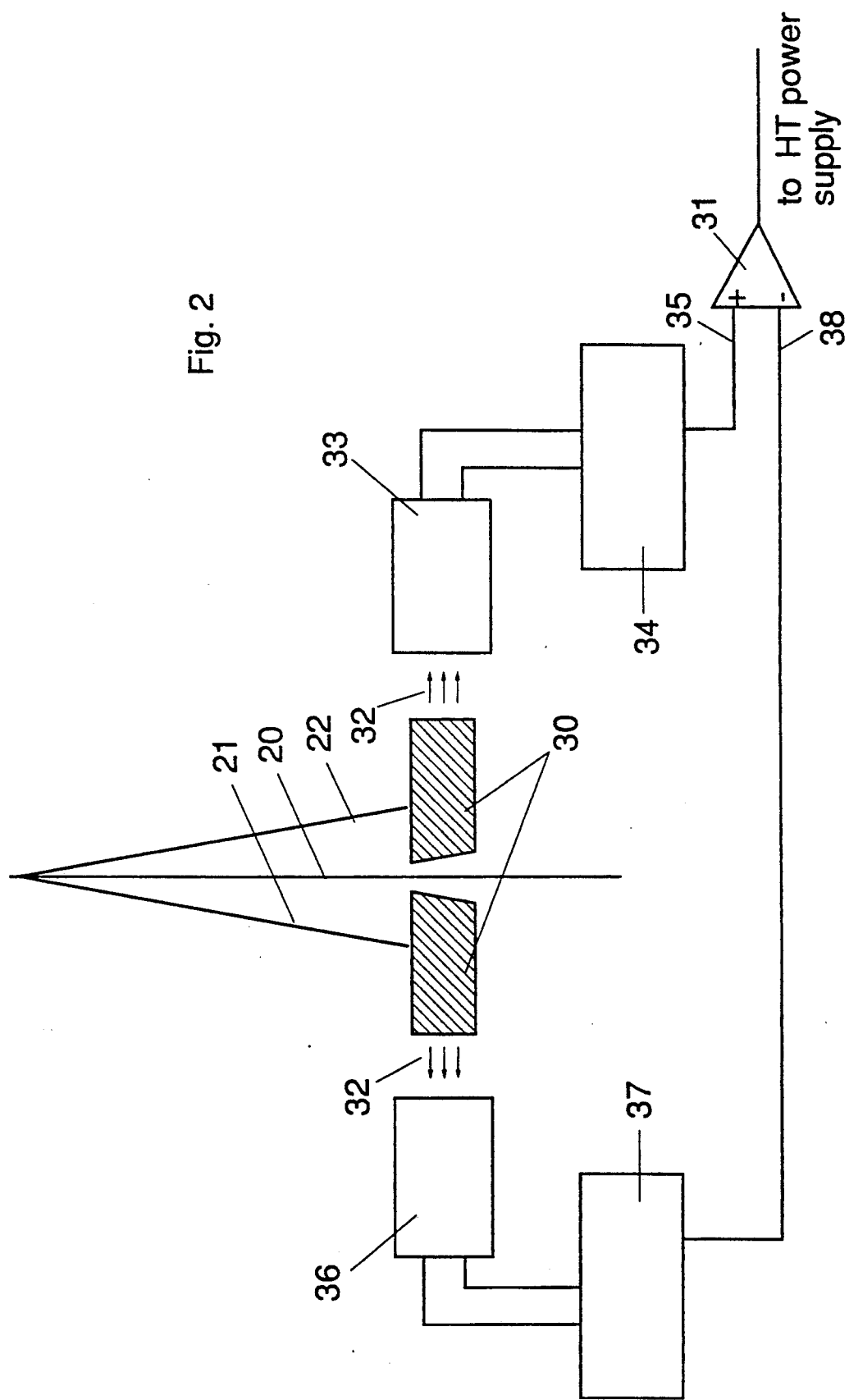

HIGH RESOLUTION ELECTRON ENERGY LOSS SPECTROMETER

BACKGROUND OF THE INVENTION

1. Field of the Invention

The invention relates to electron energy loss spectrometers, and particularly to high resolution electron energy loss spectrometers used with transmission electron microscopes.

2. Description of Prior Art

When a beam of medium energy (10 keV to 10 MeV) electrons traverses a thin sample, the electrons loose various amounts of energy which are characteristic of the sample. If the beam is subsequently dispersed into an electron energy loss spectrum, much useful information can be learnt about the sample chemical composition, chemical bonding, and structural, electronic and vibrational properties.

The actual amount of information present in the energy loss spectrum depends on the spectrum's energy resolution. Information on the sample chemistry is present in spectra of about 3 eV resolution, information on the chemical bonding requires about 0.5 eV resolution, information on the sample electronic properties requires about 0.1 eV resolution, and information on the sample vibrational properties is typically only present in spectra which show a resolution of a few meV (millielectron Volts). Consequently, there is much interest in improving the energy resolution of electron energy loss spectrometers. There is also considerable interest in improving the spatial resolution of energy loss spectroscopy so that very small sample areas can be analyzed selectively. High spatial resolution is achieved by combining energy loss spectrometers with bright electron guns and probe-forming lenses that are able to focus an electron beam into a probe of 1 nm or less in diameter. Because transmission electron microscopes typically comprise both bright electron guns and high-performance probe-forming lenses, there is much interest in incorporating high resolution electron energy loss spectrometers into the columns of transmission electron microscopes.

The energy resolution of electron spectrometer systems is limited by several parameters. The chief among these are the energy spread of the electron gun, and the instabilities of the high voltage power supply of the electron gun and of the power supplies of the energy analyzer(s). The energy spread of the electron gun is typically about 1 eV and rarely less than 0.2 eV. In order to attain an energy resolution better than 0.2 eV, the energy spread of the electron beam therefore has to be decreased by a monochromator before the beam reaches the sample. The instabilities of the high voltage power supply of the electron gun are typically about 0.5 V and rarely less than 0.1 V, and the instabilities of the power supplies of the spectrometer are typically comparable in their effect on the energy resolution. If the spectrometer system is not equipped with a means for canceling the influence of the instabilities on the resolution, its energy resolution is therefore limited to worse than 0.1 eV even when monochromation is employed.

An electron energy loss spectrometer using a thermionic electron gun of 30 keV primary energy, and crossed E/B field energy analyzers (of the type known as a Wien filter) for both monochromating the electron beam and producing the energy loss spectrum was designed and built by Boersch and later improved by Geiger and co-workers. This apparatus deaccelerated the electron beam to an energy of a few eV before passing it through the monochromator, reaccelerated the beam back to 30 kV before the beam traversed the sample, and then deaccelerated and reaccelerated the beam before and after passing it through the second energy analyzer. The high voltage for the electron gun and all the deaccelerating and accelerating regions came from the same power supply, thus assuring that fluctuations of even several volts in the high voltage would not affect the energy resolution of the total apparatus, which was able to deliver an energy resolution of about 3 meV. However, the need for two deaccelerating and two accelerating regions makes Boersch's design unsuitable for primary voltages higher than about 100 kV, which are desirable in an electron spectrometer system. Further, Boersch's apparatus had very poor spatial resolution. It produced spectra from mm-sized regions of the sample, whereas it would be highly desirable to be able to produce spectra from nm-sized regions.

A different type of an electron energy loss spectrometer apparatus capable of giving an energy resolution better than 0.1 eV was designed and built by Schnatterly and co-workers. This apparatus monochromated the electron beam while it was at a low energy, then accelerated the beam to a voltage of 100 kV to 200 kV, passed the beam through a sample, and finally deaccelerated the beam to a few eV before analyzing it. The gun, the monochromator, and the final energy analyzer were all held close to ground voltage, while the sample and the rest of the optical column were held at a high voltage. Schnatterly's design had the advantage of relative simplicity compared to Boersch's design, but the major disadvantage that the electron-optical components which formed the electron probe incident on the sample were all held at high voltage. This precluded the use of magnetic lenses, with the result that the smallest attainable probe size was about 0.5 mm, while an apparatus using magnetic lenses to focus 100 kV to 200 kV electrons into a small spot can easily attain a probe size of a few nm. A further major disadvantage of the Schnatterly apparatus was that because the sample was held at the high voltage, access to the sample during operation was not available. Therefore, it was not possible to do any of the operations which are customary in most electron microscopes, such as shifting the sample to select a desirable specimen area, tilting the sample to choose its orientation with respect to the electron beam, heating or cooling the sample, etc.

Most users of electron spectrometers would find significant advantage in an electron energy loss spectrometer system which combined good spatial resolution with an energy resolution of a few meV, and which was capable of operating at primary energies as high as several hundred keV or even several MeV. They would also find advantage in an electron spectrometer system which avoided the use of high voltage in places other than the electron gun, and was able to tolerate substantial instabilities of the gun high voltage power supply and of other critical power supplies such as those of the energy analyzers, without these instabilities resulting in a deterioration of the energy resolution of the total system. They would further find advantage in an apparatus which did not hold the sample at a high voltage, but to the contrary held the sample at or close to ground voltage, thereby facilitating access to the sample during an experiment.

OBJECTS AND ADVANTAGES

Accordingly, several of the objects and advantages of the present invention are: to provide an electron energy loss spectrometer which avoids the use of electron deacceleration and reacceleration to attain a good energy resolution, which can operate with electron energies of several hundreds of keV or even several MeV, which permits a spatial resolution of a few nm or better, and which holds the sample at or close to ground voltage to facilitate access to the sample during an experiment.

Readers will find further objects and advantages of the invention from a consideration of the ensuing description and the accompanying figures.

DRAWING FIGURES

FIG. 1 shows a schematic drawing of a high resolution electron energy loss spectrometer utilizing $\Omega$-filters for both the monochromator and the energy analyzer; and FIG. 2 shows a schematic cross-section of an energy-selecting slit utilizing scintillators and photomultiplier tubes to monitor the position of an electron beam.

DRAWING REFERENCE NUMERALS

10—electron gun
11—gun power supply
12—energy analyzer
13—electrically isolated drift tube
14—deflector
15—analyzer power supply
16—energy analyzer
17—electrically isolated drift tube
18—deflector
20—undispersed electron beam
21—intercepted electron beam
22—intercepted electron beam
23—transmitted (monochromated) electron beam
24—dispersed electron beam
25—dispersed electron beam
26—dispersed electron beam
30—energy-selecting slit
31—comparator
32—light
33—photomultiplier tube (PMT)
34—PMT power supply and amplifier
35—PMT amplifier output
36—PMT
37—PMT power supply and amplifier
38—PMT amplifier output
40—coupling lens(es)
41—magnifying lens(es)
42—probe-forming lens(es)
43—collecting lens(es)
44—magnifying lens(es)
50—transmission sample
60—electron detector

DESCRIPTION

FIG. 1 shows a schematic view of a high resolution electron energy loss spectrometer apparatus of the invention. The electron gun 10 produces an electron beam whose energy is typically 0.2 to 2 eV, depending on the type of gun and operating conditions employed. The preferred gun is a cold field emission gun giving a brightness of the order of $10^9$ Amperes/($cm^2$steradian) and an energy spread of the order of 0.25 eV. Other suitable guns comprise thermally assisted field emission, Schottky, and thermionic tungsten or $LaB_6$ guns. The electron beam 20 produced by the gun passes through coupling lenses 40, and enters an energy analyzer 12. The preferred coupling lenses are one or two electromagnetic round lenses. Other suitable types comprise electrostatic round lenses, and electromagnetic or electrostatic quadrupole lenses. The preferred energy analyzer is an electromagnetic $\Omega$-filter which makes the electrons follow trajectories resembling the Greek letter $\Omega$. This type of analyzer permits an in-line design of the overall instrument, gives a relatively high energy dispersion, and transforms an entering round beam into an exiting round beam. An especially suitable type of an $\Omega$-filter comprising four magnetic sectors and auxiliary sextupole lenses which allow second-order aberations to be minimized has been described by Lanio. However, other energy analyzers such as single magnetic sectors, magnetic alpha-filters, Wien filters, or even purely electrostatic filters could all be used.

The electron beam exiting the energy analyzer is dispersed in energy, and the energy dispersion is increased further by an adjustable amount by the magnifying lens or lenses 41. Round lenses and quadrupoles are both suitable for this application. The dispersed beam is depicted schematically as three beams 21, 22, and 23, which are incident on an energy-selecting slit 30. The slit allows the central beam 23 to pass through, but intercepts the side beams 21 and 22, thereby decreasing the energy width of the electron beam by a process known as monochromation. The intensity of the intercepted beams is sensed by the two halves of the slit which are electrically isolated. The electron signal collected on each half of the slit is sent to a comparator 31. The comparator is able to sense a shift in the position of the dispersed beam on the slit by detecting a change in the electron intensity incident on one half of the slit relative to the intensity incident on the other half. The output of the comparator is sent to a stabilization circuit inside the high voltage power supply 11, which adjusts the high voltage as necessary to stabilize the position of the electron beam on the slit 30. An alternate stabilization scheme, especially suitable for use with magnetic analyzers, employs an electrically isolated drift tube 13 inside the analyzer 12, and adjusts the voltage on the drift tube by small amounts so that the electrons inside the analyzer are accelerated or retarded as needed to stabilize the position of the dispersed beam on the slit 30. Yet another suitable stabilization scheme employs a deflector 14 situated between the analyzer 12 and the slit 30, and adjusts the strength of the deflection as needed to stabilize the position of the beam on the slit 30. By actively stabilizing the beam position on the slit 30, unavoidable instabilities in the gun high voltage power supply and the power supplies of the energy analyzer are prevented from deteriorating the energy width or the stability of the monochromated beam 23.

The energy spread of the monochromated beam 23 can be adjusted by mechanically changing the width of the opening of slit 30, or by changing the operating condition of magnifying lens(es) 41. This capability is necessary for selecting the optimum compromise between an electron beam of very small energy spread but weak intensity, and an electron beam of increased energy spread but higher intensity.

The monochromated electron beam 23 enters probe-forming lenses 42, where it is shaped into a probe with the desired spatial and angular spread. The preferred probe-forming lenses are one or more magnetic round lenses, but other optical elements such as magnetic quadrupoles are also suitable. The shaped beam then passes through a thin sample 50, in which many of the electrons experience characteristic energy losses. The scattering inside the sample increases the angular as well as the energy spread of the electron beam. The beam then enters the collecting lenses 43, which render the electron beam more parallel by compressing the angular spread of the electrons. The preferred collecting lens assembly comprises the post-specimen field of a condenser-objective round magnetic lens whose pre-specimen field focuses the electron beam into a narrow probe on the sample. Further round or quadrupole lenses may be added in order to make both the degree of the angular compression and the effective camera length of the collecting lens assembly adjustable. The beam also passes through apertures which are employed to define the angular and/or the spatial extent of the electron beam accepted for analysis, and which are situated either inside or between the collecting lenses.

The beam then enters the energy analyzer 16 which disperses it according to the energy of the electrons. The preferred analyzer is one which is of the same type as the analyzer 12 used for monochromating the electron beam. The dispersion of the spectrum is augmented by magnifying lenses 44, which are preferably of the same type as magnifying lenses 41. The dispersed electron beam, shown schematically as three beams 24, 25, and 26, then impinges on an electron detector 60. The preferred detector is a parallel detector which is able to detect a whole dispersed spectrum simultaneously with good detective quantum efficiency, but other detectors such a serial detector comprising an energy-selecting slit, a scintillator, and a photomultiplier tube could also be used.

The energy analyzer 16 is linked to the energy analyzer 12 which forms part of the monochromator in such a manner that the analyzer 16 automatically tracks the energy selected by analyzer 12. With the preferred magnetic analyzers, this can be accomplished simply by running the windings of the two analyzers in series, so that precisely the same current from power supply 15 passes through both analyzers at all times. With electrostatic analyzers, it can be accomplished by supplying the voltages from power supply 15 to the analyzer electrodes in parallel, so that precisely the same voltages appear on the equivalent electrodes at all times. Further, all additional deflection circuits employed in analyzer 12 are duplicated in analyzer 16. In this way, analyzer 16 operates exactly as analyzer 12, and instabilities of the gun high voltage relative to the analyzer power supplies are automatically compensated, just as they were in analyzer 12.

The analyzer 16 further employs an auxiliary deflector 18 which is not part of the tracking scheme. This deflector enables the dispersed spectrum to be shifted by small amounts on the detector 60, so that the part of the spectrum selected for deflecting can be chosen arbitrarily. A weak deflecting dipole or electrostatic deflecting plates situated after the analyzer 16, or an additional winding of a few turns added to the main winding(s) of a magnetic spectrometer, are all suitable as the auxiliary deflector. The total strength of the deflector is kept deliberately weak, so that unavoidable instabilities of the order of 1 part in $10^6$ in the deflector powers supply only produce displacements of the spectrum equivalent to less than one meV.

The attainable energy resolution of the apparatus of the invention is chiefly limited by the effectiveness of the stabilization scheme employed in the monochromator, and by the quality of the magnetic shields protecting the electron beam from stray magnetic fields. In principle, energy resolution of a few meV is attainable even with instruments employing primary energies of several hundred keV, thereby delivering an unprecedented fractional resolution of 1 part in $10^8$ and better. At the same time, the probe-forming capabilities of the apparatus can be made similar to the sub-nm probe-forming capabilities of the best electron microscopes, thus delivering an unsurpassed combination of energy and spatial resolution.

FIG. 2 shows an alternate embodiment of the energy-selecting slit 30. In this embodiment, the parts of the two halves of the slit 30 which intercept the electron beams 21 and 22 are made from a scintillating material such as a single-crystal YAG scintillator. Light 32 produced by the electrons impinging on the two halves of the slit is transmitted to photomultipliers 33 and 36. The signal from the photomultipliers is amplified by amplifiers 34 and 37. The amplifier outputs 35 and 38 are sent to comparator 31, whose output is used in the stabilization scheme. Although more complicated than the simple scheme shown in FIG. 1, the scheme of FIG. 2 has the advantage of being more sensitive to smallchanges in the intensities of the electron beams incident on the two halves of the slit, and is therefore better able to track small and fast changes in the position of the beam on the slit 30. Yet another possible embodiment of the slit 30 uses a semiconductor detector for each half of the slit, thereby also achieving an amplification of the incident electron signal.

While the above description contains many specificities, the reader should not construe these as limitations on the scope of the invention, but merely as exemplifications of the preferred embodiment thereof. Those skilled in the art will envisage other possible variations within its scope. For example, the parallel detector 60 could be replaced by an imaging device comprising an energy-selecting slit followed by image- or diffraction pattern-forming lenses and aone- or two-dimensional electron detector. The apparatus of the invention would then be able to form energy-selected images or diffraction patterns of the sample with excellent energy, spatial, and angular resolutions, without having to resort to scanning the electron beam incident on the sample. As another example, the apparatus of the invention could be incorporated into an existing electron microscope, in which it would use all the elements of the microscope, and simply insert energy analyzer 12 and energy-selecting slit 30 between the electron gun and the sample chamber, and energy analyzer 16 between the sample chamber and the electron detector of the microscope. In this embodiment, it may also be desirable to add magnifying lenses 41 and 44 just after analyzers 12 and 16, respectively, and to supplement or replace the electron detector of the microscope by a detector specifically tailored to detecting electron energy-loss spectra.

In yet another example, a part of the apparatus of the invention could be employed in a high voltage electron microscope to improve the microscope's spatial resolution. Microscopes operating at voltages of 1 MV and above typically suffer from high voltage instabilities which deteriorate their attainable spatial resolution. By employing the first part of the apparatus comprising the energy analyzer 12 and the energy-selecting slit 30 in the upper column of a high voltage electron microscope, the instability of the high voltage could be overcome and the attainable spatial resolution improved. Further, by employing the full apparatus of the invention, spectra with an energy resolution better than 0.1 eV would be obtainable at primary voltages as high as 2-3 MV and above.

In yet another example, the principle of making an energy analyzer track the instabilities of the gun high voltage through the projection of an energy-dispersed primary beam onto a position sensor comprising two parts which are monitored independently could also be used in a spectrometer designed to be placed entirely at the end of the optical column of an electron microscope. In such an instrument, an energy analyzer placed at the end of the microscope column would produce two separate dispersed electron beams, one of which would be used to track the position of the zero loss peak of the spectrum, and would enable the instabilities of the high voltage to be compensated. The other beam would be dispersed into a full spectrum and projected onto an electron detector similar to detector 60. The separation of the two beams could be achieved for instance by placing a double aperture containing two separate openings in front of an energy analyzer, or by periodically deflecting one dispersed beam onto a position sensor and then returning it onto electron detector 60.

What is claimed is:

1. An apparatus for producing and detecting high energy resolution electron energy loss spectra, said apparatus comprising:
   i) an electron gun generating a beam of electrons,
   ii) a first energy analyzer dispersing said beam according to electron energies,
   iii) an energy-selecting slit equipped with intensity-sensing means,
   iv) a stabilization means whereby the output of said intensity-sensing means is used to stabilize the position of said dispersed beam incident upon said energy-selecting slit,
   v) a sample illuminated by the electron beam transmitted through said energy-selecting slit,
   vi) a second energy analyzer dispersing electrons scattered by said sample into an energy-loss spectrum,
   vii) a tracking means linking the energy selected by said second energy analyzer to the energy selected by said first analyzer, and
   viii) an electron detector detecting the electron energy spectrum produced by the second energy analyzer,
whereby instabilities of the high voltage supply of the electron gun and of the power supplies of the two energy analyzers are automatically compensated and so do not deteriorate the energy resolution of electron spectra detected by said detector.

2. The apparatus of claim 1 wherein said energy analyzers are magnetic $\Omega$-filters.

3. The apparatus of claim 1 wherein said intensity sensing means is an energy-selecting slit whose two halves comprise electron scintillators whose output is detected by photomultiplier tubes.

4. The apparatus of claim 1 wherein said electron detector is a parallel detector recording the intensity falling on several detector channels simultaneously.

5. The apparatus of claim 1 further comprising one or a plurality of probe-forming lenses capable of producing a small electron probe incident on said sample.

6. The apparatus of claim 1 further comprising magnifying lenses augmenting the energy dispersion of said energy analyzers.

7. An apparatus for producing and detecting high resolution electron energy loss spectra, said apparatus comprising:
   i) an electron gun generating a beam of electrons,
   ii) a first magnetic $\Omega$-filter dispersing said beam according to electron energy,
   iii) an energy-selecting slit equipped with intensity sensors,
   iv) a stabilization means whereby the output of said intensity sensors is used to stabilize the position of said dispersed beam incident upon said energy-selecting slit,
   v) a sample illuminated by the electron beam transmitted through said energy-selecting slit,
   vi) a second magnetic $\Omega$-filter dispersing electrons transmitted through said sample into an energy-loss spectrum,
   vii) a linkage means linking the magnetic fields inside said second $\Omega$-filter to the magnetic fields inside first $\Omega$-filter, and
   viii) an electron detector detecting the electron energy spectrum produced by said second $\Omega$-filter,
whereby instabilities of the high voltage supply of the electron gun and of the power supplies of the two $\Omega$-filters are automatically compensated and so do not deteriorate the energy resolution of electron spectra detected by said electron detector.

8. The apparatus of claim 7 wherein said $\Omega$-filters are 4-sector $\Omega$ filters.

9. The apparatus of claim 7 wherein said $\Omega$-filters employ auxiliary sextupole lenses.

10. A method for producing and detecting high energy resolution electron energy loss spectra, said method comprising:
   i) producing an electron beam from an electron gun,
   ii) dispersing said beam according to electron energies in a first energy analyzer,
   iii) monochromating the beam by selecting a small range of energies of said beam with an energy-selecting slit equipped with intensity-sensing means,
   iv) stabilizing the position of said beam incident upon said energy-selecting means using the output of said intensity-sensing means,
   v) transmitting the monochromated beam through a thin sample,
   vi) dispersing the beam transmitted through said sample into an energy-loss spectrum in a second energy analyzer,
   vii) linking the energy selected by said second energy analyzer to the energy selected by said first analyzer by a linking means, and
   viii) detecting the electron energy spectrum produced by the second energy analyzer by a detector means,
whereby instabilities of the high voltage supply of the electron gun and of the power supplies of the two energy analyzers are automatically compensated and so do not deteriorate the energy resolution of electron spectra detected by said detector means.

* * * * *